(12) United States Patent
Kang et al.

(10) Patent No.: US 8,593,038 B2
(45) Date of Patent: Nov. 26, 2013

(54) DIELECTRIC COMPOSITION AND CERAMIC ELECTRONIC COMPONENT INCLUDING THE SAME

(75) Inventors: Sung Hyung Kang, Seoul (KR); Du Won Choi, Gyunggi-do (KR); Min Sung Song, Gyunggi-do (KR); Chan Hee Nam, Daejeon (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/620,638

(22) Filed: Sep. 14, 2012

(65) Prior Publication Data

US 2013/0162100 A1 Jun. 27, 2013

(30) Foreign Application Priority Data

Dec. 27, 2011 (KR) .................. 10-2011-0143295

(51) Int. Cl.
*H01L 41/187* (2006.01)

(52) U.S. Cl.
USPC ............ 310/358; 310/363; 501/139; 501/137

(58) Field of Classification Search
USPC ............... 310/311, 358, 363, 364, 365, 366;
501/138, 137, 139, 135, 136, 134;
338/20; 361/321.4, 303–305; 336/199
IPC ......................................... H01l 41/187,41/047
See application file for complete search history.

(56) References Cited

U.S. PATENT DOCUMENTS

| | | | | |
|---|---|---|---|---|
| 7,042,707 | B2* | 5/2006 | Umeda et al. ............. | 501/138 |
| 7,061,748 | B2* | 6/2006 | Ito et al. ................... | 501/137 |
| 8,088,703 | B2* | 1/2012 | Kang et al. ............... | 501/139 |
| 2003/0218856 | A1 | 11/2003 | Chazono et al. | |

FOREIGN PATENT DOCUMENTS

| | | |
|---|---|---|
| JP | 2008-230928 A | 10/2008 |
| KR | 2001-0082166 A | 8/2001 |

* cited by examiner

*Primary Examiner* — Thomas Dougherty
*Assistant Examiner* — Karen B Addison
(74) *Attorney, Agent, or Firm* — McDermott Will & Emery LLP

(57) ABSTRACT

There is provided a dielectric composition, including: a basic powder including $Ba_mTiO_3 (0.995 \leq m \leq 1.010)$; a first subcomponent including 0.1 to 0.6 mole of zirconium (Zr) oxide or carbide, based on 100 moles of the basic powder; a second subcomponent including 0.8 to 6.0 moles of oxide or carbide including at least one of magnesium (Mg), strontium (Sr), and barium (Ba); a third subcomponent including 0.2 to 1.8 moles of oxide including at least one rare earth element; a fourth subcomponent including 0.05 to 0.30 mole of oxide including at least one transition metal; a fifth subcomponent including 0.05 to 0.35 mole of oxide including at least one of vanadium (V), niobium (Nb), and tantalum (Ta); and a sixth subcomponent including 0.5 to 4.0 moles of oxide including at least one of silicon (Si) and aluminum (Al).

13 Claims, 1 Drawing Sheet

A-A'

US 8,593,038 B2

DIELECTRIC COMPOSITION AND CERAMIC ELECTRONIC COMPONENT INCLUDING THE SAME

CROSS-REFERENCE TO RELATED APPLICATIONS

This application claims the priority of Korean Patent Application No. 10-2011-0143295 filed on Dec. 27, 2011, in the Korean Intellectual Property Office, the disclosure of which is incorporated herein by reference.

BACKGROUND OF THE INVENTION

1. Field of the Invention

The present invention relates to a dielectric composition and a ceramic electronic component including the same.

2. Description of the Related Art

As representative electronic parts using a ceramic material, there may be provided a capacitor, an inductor, a piezoelectric element, a varistor, a thermistor, or the like.

Among these ceramic electronic parts, a multilayer ceramic capacitor (MLCC) has a small size, secures high capacitance, and has ease of mountability.

This multilayer ceramic capacitor is a chip type condenser, mounted on the circuit boards of various electronic products, such as an LCD or PDP image device, a computer, a personal digital assistant (PDA), a cellular phone, or the like, and thereby to be charged with or discharge electricity.

The multilayer ceramic capacitor is required to have stable capacitance and to secure reliability, even at high temperatures, in order to realize stable IC operation, since image devices such as LCDs or PDPs have recently become bigger or the generation of heat from electronic devices has become severe due to an increase in the rate of computer CPUs and the like.

This multilayer ceramic capacitor has various sizes and lamination types, depending on the usage and capacitance thereof.

In particular, in order to meet recent requirements imposed on electronic products, such as the downsizing, lightening, and multi-functionalization thereof, the multilayer ceramic capacitor used in these electronic products is also required to be ultra-miniaturized, have ultra-high capacitance, and boost voltage.

For this reason, a multi-layer ceramic capacitor in which dielectric layers and internal electrode layers are thinly formed to allow for the ultra-miniaturization of products and a large number of the dielectric layers are laminated to allow for the ultra-high capacitance of products has been manufactured.

However, in a case in which the dielectric layer is thinned and voltage is boosted when the multilayer ceramic capacitor is manufactured as above, the boosting of voltage causes electric field intensity at the dielectric layer to be increased, thereby deteriorating DC-bias characteristics and withstand voltage characteristics, and the thinning of the layer causes a fine structure to be defective, thereby deteriorating withstand voltage characteristics such as BDV, high-temperature IR, and the like.

In order to prevent these defects, it is necessary to finely granulate a basic powder. However, when grains of the basic powder are small, it is difficult to realize capacitance and temperature characteristics desired by a user. Furthermore, dielectric permittivity may be decreased.

Patent Document 1 is different from the present invention in view of subcomponent contents, and does not disclose that ceramic grains are present on a grain boundary or that the ceramic grain includes a core part and a cell part.

RELATED ART DOCUMENT (Patent Document 1) Japanese Patent Laid-Open Publication No. 2008-230928

SUMMARY OF THE INVENTION

An aspect of the present invention provides a dielectric composition and a ceramic electronic component including the same, capable of realizing the same capacitance as an existing dielectric layer, even in the case that the dielectric layer does not have a reduced size in order to secure reliability.

According to an aspect of the present invention, there is provided a dielectric composition, including: a basic powder including $Ba_mTiO_3$ ($0.995 \leq m \leq 1.010$); a first subcomponent including 0.1 to 0.6 mole of zirconium (Zr) oxide or carbide, based on 100 moles of the basic powder; a second subcomponent including 0.8 to 6.0 moles of oxide or carbide including at least one of magnesium (Mg), strontium (Sr), and barium (Ba), based on 100 moles of the basic powder; a third subcomponent including 0.2 to 1.8 moles of oxide including at least one rare earth element, based on 100 moles of the basic powder; a fourth subcomponent including 0.05 to 0.30 mole of oxide including at least one transition metal, based on 100 moles of the basic powder; a fifth subcomponent including 0.05 to 0.35 mole of oxide including at least one of vanadium (V), niobium (Nb), and tantalum (Ta), based on 100 moles of the basic powder; and a sixth subcomponent including 0.5 to 4.0 moles of oxide including at least one of silicon (Si) and aluminum (Al), based on 100 moles of the basic powder.

Here, a value of the first subcomponent/the fifth subcomponent may be 0.75 to 1.50.

The rare earth element of the third subcomponent may be selected from the group consisting of Sc, Y, La, Ac, Ce, Pr, Nd, Pm, Sm, Eu, Gd, Tb, Dy, Ho, Er, Tm, Yb and Lu.

The transition metal of the fourth subcomponent may be selected from the group consisting of Cr, Mo, W, Mn, Fe, Co and Ni.

According to another aspect of the present invention, there is provided a ceramic electronic component, including: a ceramic element having a plurality of dielectric layers laminated therein; a plurality of internal electrodes formed within the ceramic element; and at least one pair of external electrodes formed on an external surface of the ceramic element and electrically connected to the internal electrodes, wherein the dielectric layers include a basic powder including $Ba_mTiO_3$ ($0.995 \leq m \leq 1.010$); a first subcomponent including 0.1 to 0.6 mole of zirconium (Zr) oxide or carbide, based on 100 moles of the basic powder; a second subcomponent including 0.8 to 6.0 moles of oxide or carbide including at least one of magnesium (Mg), strontium (Sr), and barium (Ba), based on 100 moles of the basic powder; a third subcomponent including 0.2 to 1.8 moles of oxide including at least one rare earth element, based on 100 moles of the basic powder; a fourth subcomponent including 0.05 to 0.30 mole of oxide including at least one transition metal, based on 100 moles of the basic powder; a fifth subcomponent including 0.05 to 0.35 mole of oxide including at least one of vanadium (V), niobium (Nb), and tantalum (Ta), based on 100 moles of the basic powder; and a sixth subcomponent including 0.5 to 4.0 moles of oxide including at least one of silicon (Si) and aluminum (Al), based on 100 moles of the basic powder.

Each dielectric layer may include ceramic grains including the basic powder and the first to sixth subcomponents and grain boundaries present between the ceramic grains, and each of the ceramic grains includes a core part and a shell part surrounding the core part.

The ceramic grains may be present on the grain boundaries.

The dielectric layers each may have a thickness of 0.2 to 10 μm.

The internal electrodes may include nickel (Ni) or a Ni alloy.

The internal electrodes and the dielectric layers may be alternately laminated.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
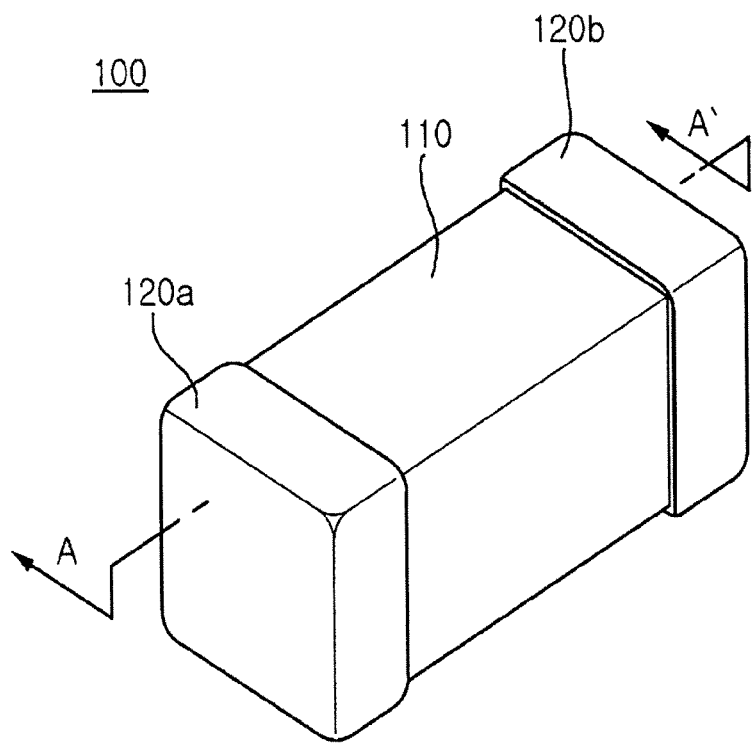
FIG. 1 is a perspective view schematically showing a multilayer ceramic capacitor according to an embodiment of the present invention.

Hereinafter, embodiments of the present invention will be described in detail with reference to the accompanying drawings.

However, the invention may be embodied in many different forms and should not be construed as being limited to the embodiments set forth herein.

The embodiments of the present invention are provided so that those skilled in the art may more completely understand the present invention.

In the drawings, the shapes and dimensions may be exaggerated for clarity, and the same reference numerals will be used throughout to designate the same or like components.

In addition, like reference numerals denote parts performing similar functions and actions throughout the drawings.

In addition, unless explicitly described otherwise, "comprising" any components will be understood to imply the inclusion of other components but not the exclusion of any other components.

The present invention is directed to a dielectric composition, and a ceramic electronic component including the dielectric component according to an embodiment of the present invention is a multilayer ceramic capacitor, an inductor, a piezoelectric element, a varistor, a chip resistor, a thermistor, or the like. The multilayer ceramic capacitor will be described as one example of the ceramic electronic product as follows.

Figure 2:
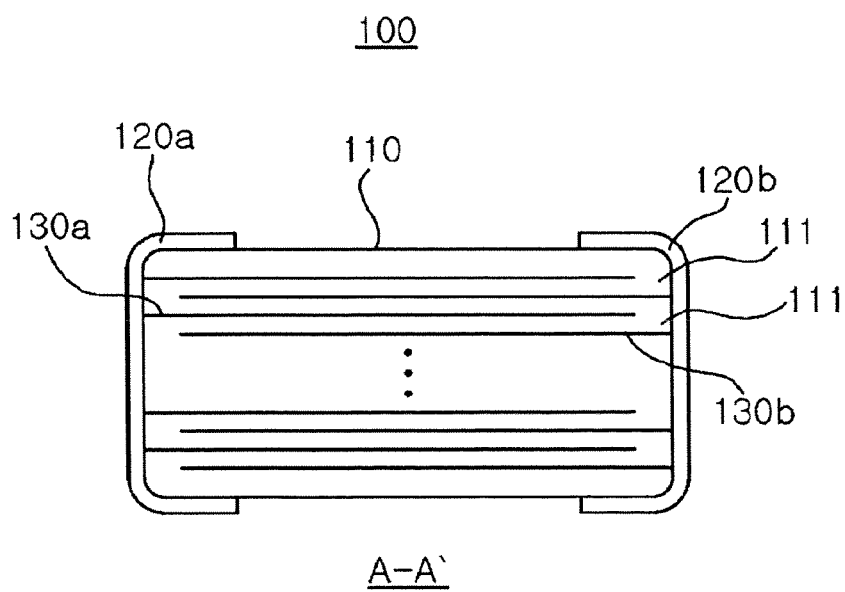
FIG. 2 is a cross-sectional view taken along line A-A' of FIG. 1.

Referring to FIGS. 1 and 2, a multilayer ceramic capacitor 100 according to an embodiment of the present invention may include a ceramic element 110 in which a plurality of dielectric layers 111 and a plurality of first and second internal electrodes 130a and 130b having different polarities are alternately laminated.

First and second external electrodes 120a and 120b may be formed on both end portions of the ceramic element 110 while they are electrically connected to the respective first and second internal electrodes 130a and 130b alternately disposed within the ceramic element 110.

The ceramic element 110 is not particularly limited in view of a shape thereof, but may have a rectangular parallelepiped shape.

In addition, the ceramic element 110 is not particularly limited in view of a dimension thereof, but may have an appropriate dimension depending on usage thereof.

The thickness of each dielectric layer 111 may be arbitrarily changed depending on designed capacitance of the capacitor. In the case of the dielectric layers 111 having an extremely small size, the number of grain boundaries present within each dielectric layer is small, resulting in deterioration in reliability.

Therefore, in the embodiment, the thickness of each dielectric layer 111 after firing may be set to be 0.2 μm or more. Preferably, the thickness of each dielectric layer 111 may be set to be 0.2 to 10.0 μm, but the present invention is not limited thereto.

The first and second internal electrodes 130a and 130b may be laminated such that end portions thereof are alternately exposed through both end portions of the ceramic element 110, facing each other.

A conductive material contained in the first and second internal electrodes 130a and 130b is not particularly limited, but a non-metal may be used since a material constituting the dielectric layers 111 needs to have resistance to reduction.

Nickel (Ni) or a Ni alloy may be used as the non-metal. As the nickel alloy, Ni and at least one element selected from a group consisting of manganese (Mn), chromium (Cr), cobalt (Co), and aluminum (Al) may be used.

The first and second external electrodes 120a and 120b may be formed to cover both end portions of the ceramic element 110 and electrically connected to the exposed end portions of the first and second internal electrodes 130a and 130b, which are alternately exposed through both end portions of the ceramic element 110, thereby forming a capacitor circuit.

The conductive material contained in the first and second external electrodes 120a and 120b is not particularly limited; however, Ni, Cu, or an alloy thereof having excellent electric conductivity may be used therefor.

The dielectric layers 111 constituting this ceramic element 110 may contain a dielectric composition having resistance to reduction.

A dielectric composition according to the embodiment may include: a basic powder including $Ba_mTiO_3$ ($0.995 \leq m \leq 1.010$); a first subcomponent including 0.1 to 0.6 mole of zirconium (Zr) oxide or carbide, based on 100 moles of the basic powder; a second subcomponent including 0.8 to 6.0 moles of oxide or carbide including at least one of magnesium (Mg), strontium (Sr), and barium (Ba), based on 100 moles of the basic powder; a third subcomponent including 0.2 to 1.8 moles of oxide including at least one rare earth element, based on 100 moles of the basic powder; a fourth subcomponent including 0.05 to 0.30 mole of oxide including at least one transition metal, based on 100 moles of the basic powder; a fifth subcomponent including 0.05 to 0.35 mole of oxide including at least one of vanadium (V), niobium (Nb), and tantalum (Ta), based on 100 moles of the basic powder; and a sixth subcomponent including 0.5 to 4.0 moles of oxide including at least one of silicon (Si) and aluminum (Al), based on 100 moles of the basic powder.

Here, a content of each subcomponent is based on an atomic mole of the subcomponent exemplified below.

The atomic mole means "mole %" of each element even in the case that the element is put in an oxide form or an ion form. For example, a content of oxide Y is calculated by mole % of $Y^{+3}$ even in the case that oxide Y is $Y_2O_3$.

The dielectric composition constituted as above may have high dielectric permittivity such as a dielectric constant of 4000 or more at conditions of a room temperature and 0.5

V/μM, while maintaining the same level of high-temperature characteristics, that is, a high-temperature accelerated lifespan, as compared to an existing dielectric composition, thereby securing high dielectric permittivity.

In addition, internal electrodes which may be fired at a reducing atmosphere of at least 1220° C. and include Ni or a Ni alloy at the time of manufacturing ceramic electronic products may be used.

Meanwhile, each dielectric layer 111 may include ceramic grains including the dielectric composition and grain boundaries present between the ceramic grains.

In this case, each ceramic grain may include a core part and a cell part surrounding the core part. The first to sixth subcomponents may be maldistributed in the core part or the cell part.

In addition, the ceramic grains may be present on the grain boundaries.

Hereinafter, respective components of the dielectric composition according to the embodiment of the present invention will be described in detail.

a) Basic Powder

The basic powder is a main component of the dielectric composition, and a $Ba_mTiO_3 (0.995 \leq m \leq 1.010)$ based dielectric powder may be used as the basic powder.

Here, when m is below 0.995, the dielectric composition may be easily reduced through firing under a reducing atmosphere, thereby changing to a semiconductor material. When m is above 1.010, a firing temperature of the dielectric composition may excessively rise.

b) First Subcomponent

As the first subcomponent, zirconium (Zr) oxide or carbide may be included in the dielectric composition.

The zirconium (Zr) oxide or carbide may serve to improve dielectric permittivity and maintain more stable high-temperature accelerated lifespan of the dielectric composition. The form of oxide or carbide is not particularly limited.

Here, a content of the first subcomponent may be 0.1 to 0.6 mole, based on 100 moles of the basic powder.

When the content of the first subcomponent is below 0.1 mole, it is difficult to obtain a desired capacitance. When the content of the first subcomponent is above 0.6 mole, improvements in reliability may be obtained, but it is difficult to satisfy temperature coefficient of capacitance (TCC) according to temperature changes.

c) Second Subcomponent

As the second subcomponent, oxide or carbide including at least one of Mg, Sr, and Ba may be included in the dielectric composition.

The second subcomponent may serve to impart resistance to reduction, grain growth controlling properties, and sintering stability to the dielectric composition. The form of oxide or carbide including Mg, Sr or Ba is not particularly limited, and for example, $MgO$, $MgCO_3$, or the like may be used.

Here, a content of the second subcomponent may be 0.8 to 6.0 moles, based on 100 moles of the basic powder.

When the content of the second subcomponent is below 0.8 mole, the dielectric composition may be easily reduced through firing under the reducing atmosphere and it is difficult to control grain growth. When the content of the second subcomponent is above 6.0 mole, a sintering temperature of the dielectric composition may rise and it is difficult to obtain a desired dielectric constant.

d) Third Subcomponent

As the third subcomponent, oxide including at least one rare earth element may be included in the dielectric composition.

The rare earth element may serve to improve high-temperature accelerated lifespan and stabilize a change in capacitance at a phase transition temperature (Tc) or higher, thereby securing desired temperature characteristics.

Here, the rare earth element may be at least one element selected from the group consisting of Sc, Y, La, Ac, Ce, Pr, Nd, Pm, Sm, Eu, Gd, Tb, Dy, Ho, Er, Tm, Yb, and Lu, but the rare earth element according to the embodiment of the present invention is not limited thereto.

In addition, the form of oxide including the rare earth element is not particularly limited, and may be variously changed, such as $Dy_2O_3$, $Y_2O_3$, $Ho_2O_3$ or the like, as necessary.

Here, a content of the third subcomponent may be 0.2 to 1.8 moles based on 100 moles of the basic powder in order to improve reliability in the dielectric composition.

When the content of the third subcomponent is below 0.2 mole, the high-temperature accelerated lifespan may be deteriorated, and the temperature coefficient of capacitance (TCC) according to temperature changes may be unstable.

When the content of the third subcomponent is above 1.8 moles, a desired dielectric constant may not be obtained in accordance with a rise in sintering temperature and reliability may be deteriorated due to a generation of a secondary phase.

e) Fourth Subcomponent

As the fourth subcomponent, oxide including a transition metal may be included in the dielectric composition.

The transition metal oxide may serve to increase insulation resistance (IR) and improve the high-temperature accelerated lifespan. The transition metal may be one element selected from the group consisting of Cr, Mo, W, Mn, Fe, Co, and Ni, but the transition metal according to the embodiment of the present invention is not limited thereto.

In addition, the form of oxide including the transition metal is not particularly limited, and may be variously changed, such as $MnO_2$, $V_2O_5$, $MnCO_3$, or the like, as necessary.

Here, a content of the fourth subcomponent may be 0.05 to 0.30 mole based on 100 moles of the basic powder in order to realize resistance to reduction and reliability.

When the content of the fourth subcomponent is below 0.05 mole, the high-temperature accelerated lifespan may be deteriorated, and the temperature coefficient of capacitance (TCC) according to temperature changes may be unstable.

When the content of the fourth subcomponent is above 0.30 mole, a CR value is deteriorated and a change in capacitance may be increased by lapse of time.

f) Fifth Subcomponent

As the fifth subcomponent, oxide including at least one of V, Nb, and Ta may be included in the dielectric composition.

The fifth subcomponent may cause a deterioration in IR, but may serve to improve the high-temperature accelerated lifespan and stabilize the change in capacitance at a phase transition temperature (Tc) or higher. The form of oxide including V, Nb or Ta is not particularly limited.

Here, a content of the fifth subcomponent may be 0.05 to 0.35 mole based on 100 moles of the basic powder.

When the content of the fifth subcomponent is below 0.05 mole, the high-temperature accelerated lifespan may be deteriorated. When the content of the fifth subcomponent is above 0.35 mole, the CR value may be deteriorated.

g) Sixth Subcomponent

As the sixth subcomponent, oxide including at least one of Si and Al may be included in the dielectric composition.

The sixth subcomponent may react with the basic powder as a main component or other subcomponents, to provide sinterability.

Here, a content of the sixth subcomponent may be 0.5 to 4.0 moles based on 100 moles of the basic powder in order to provide sinterability.

When the content of the sixth subcomponent is below 0.5 mole, firing may be performed at a temperature higher than a desired temperature.

When the content of the sixth subcomponent is above 4.0 moles, it is difficult to control grain growth and obtain a desired dielectric constant.

Meanwhile, when a value of the first subcomponent/the fifth subcomponent is below 0.75, the firing temperature of the dielectric composition may be lowered. However, the high-temperature accelerated lifespan may be deteriorated and a firing state of the dielectric composition may be unstable.

In addition, when the value of the first subcomponent/the fifth subcomponent is above 1.50, the firing temperature may rise.

Therefore, the value of the first subcomponent/the fifth subcomponent may preferably be set to be 0.75 to 1.50.

Hereinafter, the present invention will be described in detail through Inventive Examples and Comparative Examples, but these descriptions are to help a specific understanding of the present invention, and thus, the scope of the present invention is not limited to Inventive Examples below.

INVENTIVE EXAMPLE

A raw material selectively including a basic powder and first to sixth subcomponents in accordance with compositions and contents described in Table 1 was mixed with a dispersant and a binder through using a zirconia ball as a mixing and dispersing medium and using ethanol and toluene as a solvent, and then ball milling was performed thereon for 20 hours, thereby preparing a slurry.

The prepared slurry was molded into ceramic sheets each having thicknesses of 6.0 μm and 10 to 13 μm by using a small doctor blade type coater.

Nickel (Ni) internal electrodes were printed on the molded ceramic sheets.

Here, upper and lower covers were formed by laminating twenty ceramic sheets each having a thickness of 10 to 13 μm.

Then, a compression bar was manufactured by compressing and laminating 20 layers of printed active sheets.

Then, this compression bar was cut into chips each having a size of 3.2 mm×1.6 mm by using a cutter.

The thus cut chip was plasticized for de-bindering, fired at a temperature of about 1150 to 1250° C. for 2 hours under the reducing atmosphere, and then, subjected to heat treatment at a temperature of about 1000° C. for 3 hours for re-oxidation.

Then, the fired chip was subjected to a termination process, and left for 24 hours, and then characteristic values thereof were measured.

[Evaluation]

A room temperature capacitance and a dielectric loss of the chip were measured at conditions of 1 kHz and 1V by using an LCR meter, and a change in capacitance according to temperature was measured at a temperature range of −55° C. to 85° C.

In a high-temperature IR boost experiment at conditions of 125° C. and 1 Vr=10V/μm, a resistance degradation behavior was measured while voltage is increased by DC 10 V/μm per every voltage stage. The time period for each stage was 10 min, and resistance values were measured at intervals of 5 seconds. A high-temperature withstand voltage, that is, high-temperature accelerated lifespan was deduced from the high-temperature IR boost experiment.

In other words, as for a chip having twenty dielectric layers each dielectric layer having a thickness of about 4.5 μm after firing, high-temperature accelerated lifespan refers a voltage at which IR withstands $10^5 \Omega$ or higher when a voltage level of DC 10V/μm is applied to the chip at 150° C. for about 10 minutes and this voltage level is continuously increased and measured.

A chip dielectric constant below means a dielectric constant at conditions of a room temperature or 25° C. and 0.5V/μm.

Table 1 shows dielectric compositions having respective compositions and characteristics of X5R or X7R proto-type chips formed of the respective dielectric compositions.

TABLE 1

| | | Number of moles per 100 moles of basic powder | | | | | | | High-temperature Accelerated lifespan | CR value | Sintering temperature [° C.] |
|---|---|---|---|---|---|---|---|---|---|---|---|
| No. | χ (=1 − m) | First sub-component | Second sub-component | Third sub-component | Fourth sub-component | Fifth sub-component | Sixth sub-component | Chip dielectric constant | | | |
| spec. | Maximum | 0.1 | 0.8 | 0.20 | 0.05 | 0.05 | 0.5 | 4000 | 3Vr | 500 | |
| | Minimum | 0.6 | 5.50 | 1.8 | 0.30 | 0.35 | 4.00 | | | | 1210 |
| 1 | 0.003 | Zr 0.0 | Mg 1.2 | Y 0.4 | Mn 0.1 | Nb 0.0 | Si 1.2 | 3800 | 5Vr | 12 | |
| | | | Ba 0.8 | Yb 0.0 | Cr 0.0 | Ta 0.0 | Al 0.4 | | | 21 | |
| | | | | Dy 0.4 | Mo 0.0 | V 0.10 | | | | | |
| 2 | 0.000 | Zr 0.6 | Mg 1.2 | Y 0.4 | Mn 0.1 | Nb 0.0 | Si 1.2 | 4429 | 6Vr | 21 | 1180 |
| | | | Ba 0.8 | Yb 0.0 | Cr 0.0 | Ta 0.0 | Al 0.4 | | | 01 | |
| | | | | Dy 0.4 | Mo 0.0 | V 0.10 | | | | | |
| 3 | 0.000 | Zr 0.8 | Mg 1.2 | Y 0.4 | Mn 0.1 | Nb 0.0 | Si 1.2 | 5200 | 3Vr | 23 | 1240 |
| | | | Ba 0.8 | Yb 0.0 | Cr 0.0 | Ta 0.0 | Al 0.4 | | | 11 | |
| | | | | Dy 0.4 | Mo 0.0 | V 0.10 | | | | | |
| 4 | 0.002 | Zr 0.1 | Mg 0.0 | Y 0.4 | Mn 0.1 | Nb 0.0 | Si 1.1 | 4210 | 1Vr | 15 | 1180 |
| | | | Ba 0.8 | Yb 0.0 | Cr 0.0 | Ta 0.0 | Al 0.4 | | | 20 | |
| | | | | Dy 0.4 | Mo 0.0 | V 0.10 | | | | | |
| 5 | 0.003 | Zr 0.1 | Mg 0.3 | Y 0.4 | Mn 0.1 | Nb 0.0 | Si 0.85 | 4210 | 6Vr | 15 | 1180 |
| | | | Ba 0.5 | Yb 0.0 | Cr 0.0 | Ta 0.0 | Al 0.4 | | | 20 | |
| | | | | Dy 0.4 | Mo 0.0 | V 0.10 | | | | | |
| 6 | 0.002 | Zr 0.8 | Mg 2.0 | Y 0.1 | Mn 0.1 | Nb 0.0 | Si 3.0 | 4000 | 3Vr | 23 | 1210 |
| | | | Ba 3.5 | Yb 0.0 | Cr 0.0 | Ta 0.0 | Al 0.5 | | | 11 | |
| | | | | Dy 0.3 | Mo 0.0 | V 0.05 | | | | | |
| 7 | 0.001 | Zr 0.3 | Mg 1.2 | Y 0.2 | Mn 0.1 | Nb 0.0 | Si 1.2 | 4500 | 3Vr | 15 | 1210 |
| | | | Ba 0.8 | Yb 0.0 | Cr 0.0 | Ta 0.0 | Al 0.4 | | | 21 | |

TABLE 1-continued

| No. | χ (=1 − m) | First sub-component | Second sub-component | Third sub-component | Fourth sub-component | Fifth sub-component | Sixth sub-component | Chip dielectric constant | High-temperature Accelerated lifespan | CR value | Sintering temperature [° C.] |
|---|---|---|---|---|---|---|---|---|---|---|---|
| 8 | 0.002 | Zr 0.3 | Mg 1.2<br>Ba 0.8 | Dy 0.0<br>Y 1.4<br>Yb 0.2 | Mo 0.0<br>Mn 0.1<br>Cr 0.0 | V 0.10<br>Nb 0.0<br>Ta 0.0 | Si 1.2<br>Al 0.4 | 3800 | 4Vr | 2000 | 1210 |
| 9 | 0.001 | Zr 0.1 | Mg 1.2<br>Ba 0.8 | Dy 0.2<br>Y 0.2<br>Yb 0.0 | Mo 0.0<br>Mn 0.1<br>Cr 0.1 | V 0.10<br>Nb 0.1<br>Ta 0.0 | Si 0.5<br>Al 0.1 | 4000 | 4Vr | 1300 | 1190 |
| 10 | 0.001 | Zr 0.1 | Mg 0.5<br>Ba 0.8 | Dy 0.8<br>Y 0.2<br>Yb 0.0 | Mo 0.1<br>Mn 0.1<br>Cr 0.2 | V 0.1<br>Nb 0.1<br>Ta 0.0 | Si 1.0<br>Al 0.1 | 3700 | 5Vr | 1600 | 1180 |
| 11 | 0.002 | Zr 0.6 | Mg 0.5<br>Ba 1.2 | Dy 0.8<br>Y 0.0<br>Yb 0.0 | Mo 0.1<br>Mn 0.1<br>Cr 0.0 | V 0.1<br>Nb 0.0<br>Ta 0.0 | Si 1.2<br>Al 0.4 | 4000 | 3Vr | 631 | 1180 |
| 12 | 0.001 | Zr 0.6 | Mg 0.5<br>Ba 1.2 | Dy 0.9<br>Y 0.0<br>Yb 0.0 | Mo 0.0<br>Mn 0.1<br>Cr 0.0 | V 0.35<br>Nb 0.0<br>Ta 0.0 | Si 1.2<br>Al 0.4 | 3600 | 2Vr | 450 | 1180 |
| 13 | 0.002 | Zr 0.2 | Mg 1.2<br>Ba 1.2 | Dy 0.9<br>Y 0.0<br>Yb 0.0 | Mo 0.0<br>Mn 0.2<br>Cr 0.0 | V 0.5<br>Nb 0.0<br>Ta 0.0 | Si 4.0<br>Al 0.5 | 3200 | 1Vr | 631 | 1180 |
| 14 | 0.002 | Zr 0.3 | Mg 0.3<br>Ba 0.7 | Dy 0.3<br>Y 0.0<br>Yb 0.0<br>Dy 0.6 | Mo 0.0<br>Mn 0.2<br>Cr 0.0<br>Mo 0.0 | V 0.35<br>Nb 0.0<br>Ta 0.0<br>V 0.1 | Si 0.4<br>Al 0.1 | 4200 | 3Vr | 1302 | 1210 |

<Dielectric Compositions and Characteristics of Proto-Type Chips Manufactured by Using These Dielectric Compositions>

First, limitations caused by deviating from the content ranges of components according to the embodiment of the present invention will be described with reference to comparative examples.

Referring to Sample 1, it can be confirmed that the dielectric constant was 3800, which is lower than a reference value of 4000, in the case in which the first subcomponent was not included in the dielectric composition.

Referring to Sample 3, it can be confirmed that the sintering temperature was 1240° C., which is higher than a reference value, in the case in which the content of the first subcomponent was 0.8 mole above a reference content thereof.

Referring to Sample 4, it can be confirmed that the high-temperature accelerated lifespan was 1 Vr, which is lower than a reference value, in the case in which the content of the second subcomponent was 0.7 below a reference content thereof.

Referring to Sample 10, it can be confirmed that the dielectric constant was 3700, which is lower than a reference value of 4000, in the case in which the content of the third subcomponent was 0.4 mole below a reference content thereof.

Referring to Sample 12, it can be confirmed that the dielectric constant was 3600, a low dielectric constant, and the high-temperature accelerated lifespan and the CR value were 2 Vr and 450, respectively, which show degraded values, in the case in which the content of the fifth subcomponent was 0.5 mole above a reference content thereof.

Referring to Sample 13, it can be confirmed that the dielectric constant was 3200, a low dielectric constant, and the high-temperature accelerated lifespan was 1 Vr, a degraded value, in the case in which the content of the sixth subcomponent was 4.5 mole above a reference content thereof.

Meanwhile, Sample 2, Samples 5 to 9, Sample 11, and Sample 14 having composition ranges according to the embodiment of the present invention showed excellent dielectric constants of at least 4000 and at least 3 Vr of high-temperature accelerated lifespan.

In addition, it can be confirmed that CR values were at least 500 and the sintering temperatures were 1210° C. or lower.

Therefore, when the dielectric composition is prepared within a range satisfying these inventive examples, the same capacitance as that of an existing dielectric layer may be realized even in the case that the dielectric layer does not have a reduced size in order to secure reliability.

As set forth above, according to the embodiments of the present invention, there can be provided a dielectric composition and a ceramic electronic component including the same, capable of realizing the same capacitance as that of an existing dielectric layer even in the case that the dielectric layer does not have a reduced size in order to secure reliability.

While the present invention has been shown and described in connection with the embodiments, it will be apparent to those skilled in the art that modifications and variations can be made without departing from the spirit and scope of the invention as defined by the appended claims.

What is claimed is:

1. A dielectric composition, comprising:
   a basic powder including $Ba_m TiO_3 (0.995 \leq m \leq 1.010)$;
   a first subcomponent including 0.1 to 0.6 mole of zirconium (Zr) oxide or carbide, based on 100 moles of the basic powder;
   a second subcomponent including 0.8 to 6.0 moles of oxide or carbide including at least one of magnesium (Mg), strontium (Sr), and barium (Ba), based on 100 moles of the basic powder;
   a third subcomponent including 0.2 to 1.8 moles of oxide including at least one rare earth element, based on 100 moles of the basic powder;
   a fourth subcomponent including 0.05 to 0.30 mole of oxide including at least one transition metal, based on 100 moles of the basic powder;
   a fifth subcomponent including 0.05 to 0.35 mole of oxide including at least one of vanadium (V), niobium (Nb), and tantalum (Ta), based on 100 moles of the basic powder; and a sixth subcomponent including 0.5 to 4.0 moles of oxide including at least one of silicon (Si) and aluminum (Al), based on 100 moles of the basic powder.

2. The dielectric composition of claim 1, wherein a value of the first subcomponent/the fifth subcomponent is 0.75 to 1.50.

3. The dielectric composition of claim 1, wherein the rare earth element of the third subcomponent is selected from a group consisting of Sc, Y, La, Ac, Ce, Pr, Nd, Pm, Sm, Eu, Gd, Tb, Dy, Ho, Er, Tm, Yb and Lu.

4. The dielectric composition of claim 1, wherein the transition metal of the fourth subcomponent is selected from a group consisting of Cr, Mo, W, Mn, Fe, Co and Ni.

5. A ceramic electronic component, comprising:
a ceramic element having a plurality of dielectric layers laminated therein;
a plurality of internal electrodes formed within the ceramic element; and
at least one pair of external electrodes formed on an external surface of the ceramic element and electrically connected to the internal electrodes,
wherein the dielectric layers include a basic powder including $Ba_mTiO_3$ ($0.995 \leq m \leq 1.010$); a first subcomponent including 0.1 to 0.6 mole of zirconium (Zr) oxide or carbide, based on 100 moles of the basic powder; a second subcomponent including 0.8 to 6.0 moles of oxide or carbide including at least one of magnesium (Mg), strontium (Sr), and barium (Ba), based on 100 moles of the basic powder; a third subcomponent including 0.2 to 1.8 moles of oxide including at least one rare earth element, based on 100 moles of the basic powder; a fourth subcomponent including 0.05 to 0.30 mole of oxide including at least one transition metal, based on 100 moles of the basic powder; a fifth subcomponent including 0.05 to 0.35 mole of oxide including at least one of vanadium (V), niobium (Nb), and tantalum (Ta), based on 100 moles of the basic powder; and a sixth subcomponent including 0.5 to 4.0 moles of oxide including at least one of silicon (Si) and aluminum (Al), based on 100 moles of the basic powder.

6. The ceramic electronic component of claim 5, wherein a value of the first subcomponent/the fifth subcomponent is 0.75 to 1.50.

7. The ceramic electronic component of claim 5, wherein each dielectric layer includes ceramic grains including the basic powder and the first to sixth subcomponents and grain boundaries present between the ceramic grains, and each of the ceramic grains includes a core part and a shell part surrounding the core part.

8. The ceramic electronic component of claim 5, wherein the ceramic grains are present on the grain boundaries.

9. The ceramic electronic component of claim 5, wherein the rare earth element of the third subcomponent is selected from a group consisting of Sc, Y, La, Ac, Ce, Pr, Nd, Pm, Sm, Eu, Gd, Tb, Dy, Ho, Er, Tm, Yb and Lu.

10. The ceramic electronic component of claim 5, wherein the transition metal of the fourth subcomponent is selected from a group consisting of Cr, Mo, W, Mn, Fe, Co and Ni.

11. The ceramic electronic component of claim 5, wherein the dielectric layers each have a thickness of 0.2 to 10.0 μp.

12. The ceramic electronic component of claim 5, wherein the internal electrodes include Nickel (Ni) or a Ni alloy.

13. The ceramic electronic component of claim 5, wherein the internal electrodes and the dielectric layers are alternately laminated.

* * * * *